(12) United States Patent
Sugihara et al.

(10) Patent No.: US 8,921,241 B2
(45) Date of Patent: Dec. 30, 2014

(54) ELECTROCONDUCTIVE TAPE

(75) Inventors: Shigekazu Sugihara, Fukui (JP);
Susumu Takagi, Fukui (JP); Tetsuhiko Saiki, Fukui (JP)

(73) Assignee: Seiren Co., Ltd., Fukui (JP)

( * ) Notice: Subject to any disclaimer, the term of this patent is extended or adjusted under 35 U.S.C. 154(b) by 0 days.

(21) Appl. No.: 14/126,246

(22) PCT Filed: Dec. 16, 2011

(86) PCT No.: PCT/JP2011/079255
§ 371 (c)(1),
(2), (4) Date: Dec. 13, 2013

(87) PCT Pub. No.: WO2012/172709
PCT Pub. Date: Dec. 20, 2012

(65) Prior Publication Data
US 2014/0141673 A1  May 22, 2014

(30) Foreign Application Priority Data

Dec. 16, 2011  (JP) ................. 2011-276488

(51) Int. Cl.
*D04B 1/14* (2006.01)
*H05K 9/00* (2006.01)
*C09J 7/04* (2006.01)
*B32B 37/26* (2006.01)
*C09J 9/00* (2006.01)

(52) U.S. Cl.
CPC ............... *H05K 9/0009* (2013.01); *C09J 7/04* (2013.01); *C09J 2201/28* (2013.01); *C09J 2201/32* (2013.01); *C09J 2201/602* (2013.01); *C09J 2201/622* (2013.01); *C09J 2203/326* (2013.01); *C09J 2400/163* (2013.01); *B32B 37/26* (2013.01)
USPC ............... 442/6; 428/41.5; 428/354; 442/110

(58) Field of Classification Search
USPC ............ 428/40.1, 40.9, 41.3, 41.5, 213, 214, 428/343, 344, 349, 354, 356, 542.6; 442/1, 442/6, 15, 16, 110, 117, 149, 152, 154
See application file for complete search history.

(56) References Cited

U.S. PATENT DOCUMENTS 5,246,771 A   9/1993  Kawaguchi

FOREIGN PATENT DOCUMENTS

| | | |
|---|---|---|
| JP | 62-227986 | 10/1987 |
| JP | 1-265432 | 10/1989 |
| JP | 06-240533 | 8/1994 |
| JP | 2002-327154 | 11/2002 |
| JP | 2004-152871 | 5/2004 |
| JP | 2005-026622 | 1/2005 |
| JP | 3869348 | 10/2006 |
| JP | 2009-079347 | 4/2009 |
| JP | 4511076 | 5/2010 |
| JP | 2010-155973 | 7/2010 |
| WO | 2010-007900 A1 | 1/2010 |

*Primary Examiner* — Arti Singh-Pandey
(74) *Attorney, Agent, or Firm* — K&L Gates LLP; Louis C. Cullman; Michelle Glasky Bergman

(57) ABSTRACT

An electroconductive tape (10) is characterized in that an adhesive film (3) composed of an adhesive is provided only on the open space between threads of an electroconductive mesh fabric having a metallic coating on the surface, the metallic coating being exposed and not covered by the adhesive film (3) on both surfaces of the electroconductive mesh fabric; thermoplastic synthetic fiber monofilament thread is included in part of the threads of the electroconductive mesh fabric; a value M that is obtained by an Equation (1): $M=[(B_1+B_2)-C]/(B_1+B_2)$ is within a range of 0.05 to 0.45 (where $B_1$ is the average diameter of the monofilament in the thickness direction of the electroconductive tape at places other than at the crossing points, $B_2$ is the average diameter of the thread that crosses the monofilament in the thickness direction of the electroconductive tape at places other than at the crossing points, and C is the thickness of the electroconductive tape at the crossing points where the monofilament crosses other thread).

3 Claims, 3 Drawing Sheets

ELECTROCONDUCTIVE TAPE

CROSS REFERENCE TO RELATED APPLICATIONS

The present application is a 371 of International Application No. PCT/JP2011/079255 filed on Dec. 16, 2011, and claims the benefit to Japanese Patent Application 2011-276488 filed on Dec. 16, 2011, the contents of all of which are incorporated by reference herein in their entirety.

TECHNICAL FIELD

The present invention relates to an electroconductive tape and a method for manufacturing that tape. More specifically, the present invention relates to an electroconductive tape, having an adhesive property on both sides, and a method of manufacturing that tape.

BACKGROUND ART

Electroconductive tape is used as an electromagnetic wave shield gasket that is attached, for example, to the casing of an electronic product in order to block electromagnetic waves. In the field of portable electronic devices such as cellular phones like smartphones, or electronic devices such as personal computers, making the devices more compact and improving performance is advancing. Together with having good adhesive properties and excellent grounding characteristics, electroconductive tape that is thinner is desired for use as the electromagnetic shield gasket of these electronic devices.

As disclosed in cited Patent Literature 1, for example, there are two kinds of conventional electroconductive tape: there is tape on which metallic foil or fabric such as non-woven fabric, having an adhesive layer in which electroconductive filler is dispersed as a base material, is layered on both sides; and there is tape that is composed only of an adhesive in which electroconductive filler is dispersed. When attempting to make the former electroconductive tape thinner, the adhesive layers must be made thinner. In doing so, the adhesive layers move into the uneven areas of the base material, and the tape loses its adhesive property. In order to improve the adhesive property, it is necessary to reduce the amount of electroconductive filler. As a result, the electroconductive characteristic decreases. In the latter electroconductive tape, it is easy to make the tape thinner because a base material is not used; however, the electroconductive characteristic is insufficient with filler alone, and there is a problem in that the tape is easily damaged when handled.

Moreover, the grounding characteristic is greatly influenced by the exposed state of the electroconductive filler that is included in the adhesive layer, and the state of contact with the base material. Therefore, there is also a problem in that a stable grounding characteristic cannot be obtained depending on the application condition. Furthermore, when the electroconductive tape includes a base material, making the base material itself thinner must be considered. However, when a non-woven fabric is made thin, the tensile strength greatly decreases, and so that there is a problem in that the electroconductive tape becomes torn or damaged during handling when applying the tape. When a metallic foil is used as the base material, there is a problem in that the adhesive layers may peel off due to deformation of the metallic foil.

Therefore, in order to solve these problems, cited Patent Literature 2 discloses an adhesive sheet having an adhesive layer formed on at least one side of a base material having an electroconductive property, with part of the base material protruding from the adhesive layer. Moreover, cited Patent Literature 3 discloses an electromagnetic wave shield tape that is a woven or knitted fabric that uses metal, or an electroconductive sheet that is formed into a net shape that is embedded into an elastomer base material, and that electroconductive sheet is exposed on both the front and rear sides of the elastomer base material.

PRIOR ART LITERATURE

Patent Literature

Patent Literature 1: Japanese Patent No. 4,511,076
Patent Literature 2: Unexamined Japanese Patent Application Kokai Publication No. S62-227986
Patent Literature 3: Japanese Patent No. 3,869,348

DISCLOSURE OF THE INVENTION

Problem to be Solved by the Invention

However, in the technology disclosed in cited Patent Literature 2, when the protruding portion is increased in order to improve the electroconductivity of the applied body, the amount of adhesive is decreased, so that the adhesive property decreases. On the other hand, when the protruding portion is decreased in order to improve the adhesive characteristic, there is a problem in that the electroconductivity decreases.

Moreover, in the technology disclosed in cited Patent Literature 3, in order to improve the exposure on the front and rear, unevenness is provided over the entire electroconductive sheet. However, there is a problem in that when the amount of unevenness is great, the contact surface area with the frame becomes small, and electroconductivity in the thickness direction becomes unstable. This problem becomes more severe when the used surface area of the tape is small, or when the ground pressure is low. This is particularly unsuitable for portable types of electronic devices for which miniaturization and increased performance is advancing. Furthermore, there is a problem in that when the amount of unevenness of the electroconductive sheet is great, the electromagnetic shield tape itself becomes thick.

Taking these problems into consideration, it is the objective of the present invention to provide an electroconductive tape to be used for blocking electromagnetic waves in an electronic device that, together with being thinner and having an excellent grounding characteristic and a high adhesive property, also has excellent handling characteristics when performing the work of applying the tape.

Means for Solving the Problem

In order to accomplish the object above, the electroconductive tape according to a first aspect of the present invention includes:

electroconductive mesh fabric having a metallic coating on the surface thereof; and an adhesive film that is composed of an adhesive that is formed in only the open space between threads of the electroconductive mesh fabric; wherein the metallic coating is exposed and not covered by the adhesive film on both surfaces of the electroconductive mesh fabric;

at least some of the threads of the electroconductive mesh fabric include thermoplastic synthetic fiber monofilament thread; and an M value that is obtained by Equation 1 below is within a range of 0.05 to 0.45.

[Equation 1]

$$M=[(B_1+B_2)-C]/(B_1+B_2) \quad \text{Eq. 1}$$

(where

B1: Average diameter of the monofilament in the thickness direction of the electroconductive tape at places other than at the crossing points;

B2: Average diameter of the thread that crosses the monofilament in the thickness direction of the electroconductive tape at places other than at the crossing points;

C: Thickness of the electroconductive tape at the crossing points where the monofilament crosses other thread).

Moreover, preferably the thermoplastic synthetic fiber monofilament thread has an average oblateness in the cross-sectional shape within a range of 1.1 to 3.0.

Furthermore, preferably the opening percentage of the electroconductive mesh fabric is within a range of 45 to 90%.

In order to accomplish the object above, the method of manufacturing electroconductive tape according to a second aspect of the present invention has:

a step of preparing an electroconductive mesh fabric having a metallic coating on the surface thereof, and where at least part of the composition of the fabric includes thermoplastic synthetic fiber monofilament thread;

a step of applying an adhesive having fluidity on top of a peel-type sheet, and forming an adhesive layer having a thickness that is within a range of 50 to 90% of the maximum thickness of the electroconductive mesh fabric;

a step of layering the electroconductive mesh fabric on top of the adhesive layer, and further layering and laminating another peel-type sheet on the top thereof; and a step of performing aging to harden the adhesive layer and to form an adhesive film; wherein the electroconductive tape has an M value obtained from Equation 1 below that is within a range of 0.05 to 0.45.

[Equation 2]

$$M=[(B_1+B_2)-C]/(B_1+B_2) \quad \text{Eq. 1}$$

(where

B1: Average diameter of the monofilament in the thickness direction of the electroconductive tape at places other than at the crossing points;

B2: Average diameter of the thread that crosses the monofilament in the thickness direction of the electroconductive tape at places other than at the crossing points;

C: Thickness of the electroconductive tape at the crossing points where the monofilament crosses other thread).

Effects of the Invention

With the present invention, adhesive film is formed in only the open space between threads of electroconductive mesh fabric, so that it is possible to achieve both an excellent grounding characteristic and strength, and it is also possible to make an electroconductive tape having a very thin thickness. Moreover, because the value of M that is obtained from Equation 1 is within a range of 0.05 to 0.45, the smoothness of the surface of the electroconductive tape is maintained, and together with obtaining a sufficient grounding characteristic and adhesive property, the strength is maintained and the electroconductive tape has excellent handling characteristics.

MODE FOR CARRYING OUT THE INVENTION

Figure 1:
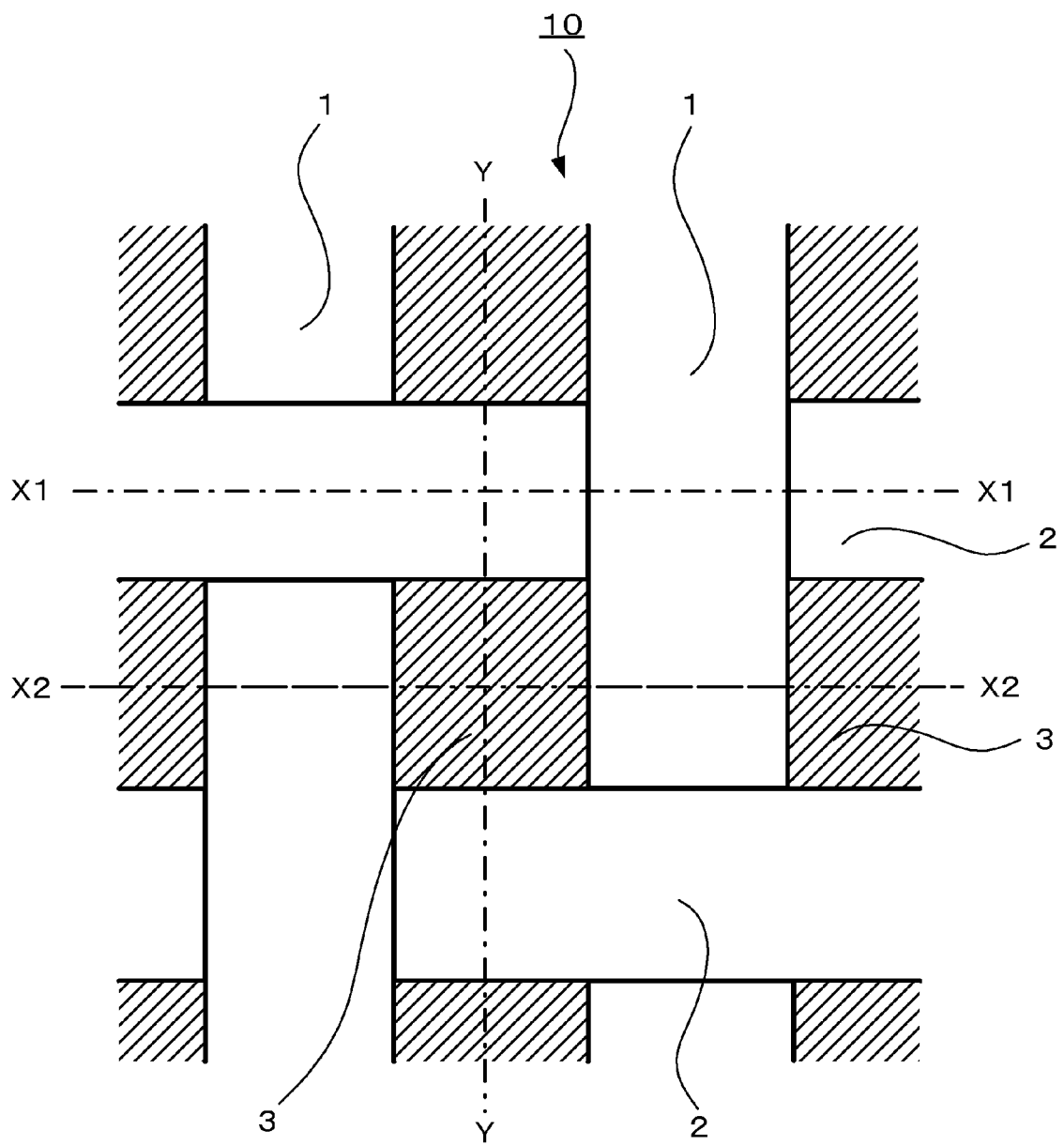
FIG. 1 is a schematic plan view illustrating part of the electroconductive tape of an embodiment of the present invention.

The electroconductive mesh fabric that is used in the embodiments of the present invention, from the aspect of thinness and flexibility, is a mesh fabric that includes at least in part thermoplastic synthetic fiber monofilament thread on the surface thereof, and on which a metallic coating is formed by a method using known technology such as a vapor deposition method, a sputtering method, an electroplating method, an electroless plating method and the like.

The fiber material that can be used as the thermoplastic synthetic fiber monofilament thread can be polyester type (polyethylene-telephthalate, polybutylene terephthalate, and the like), polyamide type (nylon 6, nylon 66, and the like), polyolefin type (polyethylene, polyproylene, and the like), polyacrylonitrile type, polyvinyl alcohol type, and polyurethane type and the like; and of these, a combination of two types or more is also possible. Of these, when taking into consideration workability and durability, fiber using polyester thread is preferred.

When mixed with a thread other than a thermoplastic synthetic fiber monofilament thread, that fiber material is not particularly limited, and in addition to synthetic fiber, it is possible to use natural fiber or semisynthetic fiber.

The structure of the mesh fabric is not particularly limited, and plain weave, satin weave, twill weave and the like are possible; however, from the aspect of the warp thread and weft thread having a superior high-strength binding force, a plain weave is preferred.

The thermoplastic synthetic fiber thread that is used in one of the warp thread and/or weft thread of the mesh fiber is monofilament thread. The monofilament thread is preferably a flat thread. That oblateness is preferably within the range 1.1 to 3.0, and more preferably within the range 1.1 to 2.5. The oblateness is the value of the long side "a" of a rectangle divided by the short side "b" when the cross-sectional shape of the monofilament is plotted as a circumscribed rectangle. When the oblateness is less than 1.1, the smoothness of the thread surface is poor, so that the contact surface area with the frame is reduced, and there is a possibility that a stable grounding characteristic will not be obtained. When the oblateness is greater than 3.0, there is a possibility that the strength of the monofilament thread will decrease. Moreover, it becomes difficult to maintain the opening percentage of the mesh fabric, and as a result, there is a possibility that the adhesive property of the electroconductive tape will decrease.

The monofilament thread can be flat thread from the time that the thread is formed, or can be made flat thread through processing after the mesh fabric has been formed. As the method of forming flat thread by processing, is a method in which the temperature is raised to a temperature at which the monofilament thread displays a thermoplastic property, and then in that state, stress that promotes deformation is applied. More specifically, the fabric is pressed with a heated metallic plate, or is compressed between heated rollers. Moreover, it is also possible to deform the thread to flat thread by applying tension in the warp direction or weft direction of the mesh fabric in a heated state.

Furthermore, the monofilament thread can also be heat-seal thread. Heat-seal thread is thread that substantially comprises fiber having a lower melting point when compared with typical synthetic fiber. This thread shows behavior of melting under heat treatment conditions during normal fiber processing, which results in deformation or melting and sticking with other thread. The monofilament thread can also be partial heat-seal thread having a core sheath structure such that only the sheath portion has a heat seal component.

The mesh fabric is a fabric having more openings when compared with a typical fabric. Pairs of warp threads and weft threads of the fabric are arranged such that they are separated by a specified distance. Therefore, being a fabric, there exists crossing points (points where threads overlap and cross) of warp threads and weft threads; however, there are also many points where compared with a typical fabric the warp threads and weft threads do not cross (do not overlap). The mesh fabric that is used in the electroconductive tape of the present invention preferably comprises 45 to 90% opening percentage, and more preferably 60 to 85% opening percentage. The opening percentage is determined through the ratio of the amount of area that the open space between threads occupy per unit surface area when a sheet shaped mesh fabric is projected onto a flat surface. When the opening percentage is greater than 90%, the surface area of the mesh fabric surface that comes in contact with the frame is decreased, so that there is a possibility that a sufficient grounding characteristic will not be obtained. In addition, there is a possibility that the electromagnetic wave shielding itself will be insufficient. Furthermore, there is a possibility that the strength of the mesh fabric will decrease and that the handling ability will become bad. On the other hand, when the opening percentage is less than 45%, there is a possibility that sufficient adhesion will not be obtained. Moreover, pressing the adhesive into the open space between threads becomes difficult, and thus there is a possibility that differences in bonding strength will occur on the front and rear.

The adhesive that is used for the electroconductive tape is not particularly limited; however, it is possible to use a typically used known acrylic type adhesive or rubber type adhesive as the base polymer, and to mix in various kinds of additives to these.

As an acrylic type adhesive, it is possible to use a known acrylic type adhesive that is obtained by using an ester monomer methacrylate such as methyl methacrylate, ethyl methacrylate, propyl methacrylate, n-butyl methacrylate, 2-ethylhexyl methacrylate, isooctyl methacrylate, nonyl methacrylate, isononyl methacrylate and the like as a main component, and then as necessary copolymerizing these with a monomer that includes a functional group such as methacrylate, crotonic acid, fumaric acid, itaconic acid, maleic anhydride and the like, or vinyl acetate, acrylonitrile styrene, methacrylic acid 2-hydroxyethyl, 2-methyl-ethyl-acrylamide and the like.

As a rubber type adhesive, it is possible to use, for example, an adhesive that is obtained by mixing one type or a combination of two types or more of an elastomer component such as natural rubber, styrene-butadiene rubber, isobutylene-isoprene rubber, isoprene rubber, butadiene rubber, styrene isoprene block copolymer and the like, with rosin based resin, tempel based resin, aliphatic oil resin, aromatic series based oil, coploymer oil resin, alicyclic oil resin, coumarone-indene resin, pure monomer-based resin, phenolic resin, xylene based resin and the like.

In this embodiment of the present invention, it is not necessary for the adhesive to include an electroconductive filler. However, it is possible to include an electroconductive filler for the purpose of assisting the electroconductive mesh fabric. As an electroconductive filler it is possible to use a metallic filler such as nickel powder, silver powder, copper powder, silver coated copper powder and the like, or carbon.

In the electroconductive tape of this embodiment of the present invention, it is necessary that the value of M that is obtained in the following Equation 1 be within the range 0.05 to 0.45.

[Equation 3]

$$M=[(B_1+B_2)-C]/(B_1+B_2) \qquad \text{Eq. 1}$$

(where
$B_1$: Average diameter of the monofilament in the thickness direction of the electroconductive tape at places other than at the crossing points;
$B_2$: Average diameter of the thread that crosses the monofilament in the thickness direction of the electroconductive tape at places other than at the crossing points;
C: Thickness of the electroconductive tape at the crossing points where the monofilament crosses other thread).

Equation 1 will be explained in detail using the figures. FIG. 1 is a top view of electroconductive tape 10 having electroconductive mesh fabric that uses the same monofilament for both the warp thread and weft thread. Pairs of warp thread 1 and pairs of weft thread 2 are arranged at specified spacing, with open space between threads being formed by this spacing. Adhesive film 3 is formed in the open space between threads.

Figure 2:
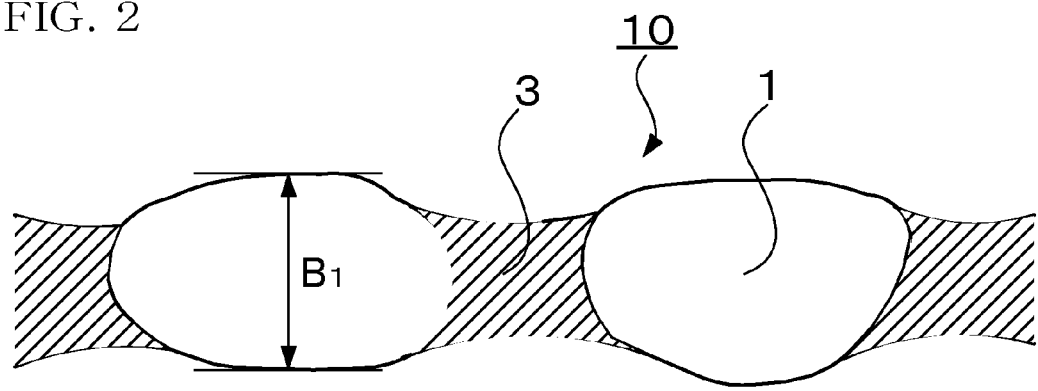
FIG. 2 is a longitudinal sectional schematic view illustrating section X2-X2 in FIG. 1.
Figure 3:
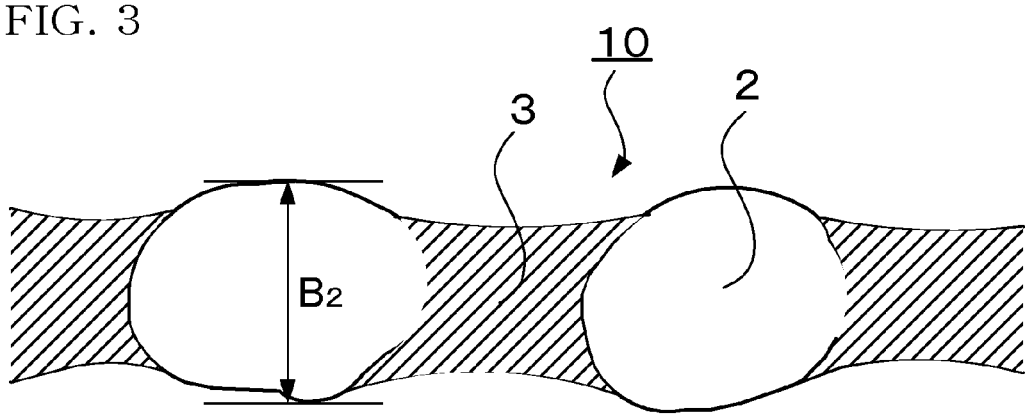
FIG. 3 is a longitudinal sectional schematic view illustrating section Y-Y in FIG. 1.
Figure 4:
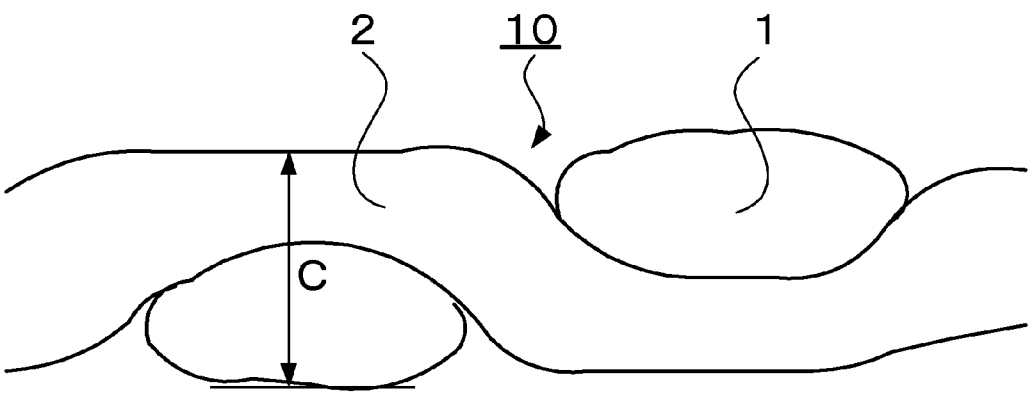
FIG. 4 is a longitudinal sectional schematic view illustrating section X1-X1 in FIG. 1.

FIG. 2 is a longitudinal sectional view illustrating section X2-X2 in FIG. 1. In this portion, the warp thread 1 and weft thread 2 do not cross. In this portion, the average diameter of the monofilament (warp thread 1) in the thickness direction of the electroconductive tape 10 is taken to be $B_1$. FIG. 3 is a longitudinal sectional view illustrating section Y-Y in FIG. 1. The average diameter of the weft thread 2 in this portion in the thickness direction of the electroconductive tape is taken to be $B_2$ in Equation 1. Furthermore, FIG. 4 is a longitudinal sectional view of section X1-X1 in FIG. 1. The crossing point of the warp thread 1 and the weft thread 2 is included, and the thickness of the electroconductive tape 10 at this crossing point is C.

Figure 5:
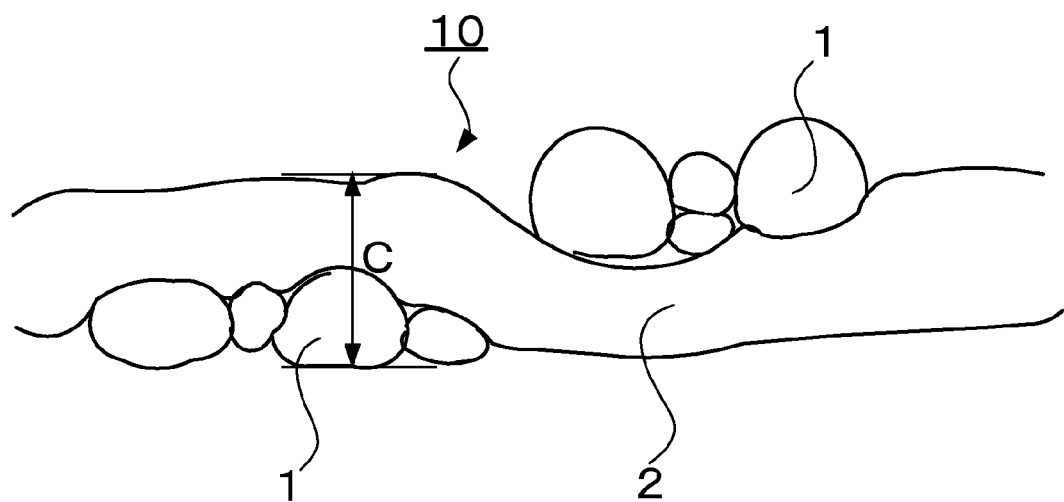
FIG. 5 is a longitudinal sectional schematic view illustrating section X1-X1 in FIG. 1; when the warp thread is a multi-filament thread.
Figure 6:
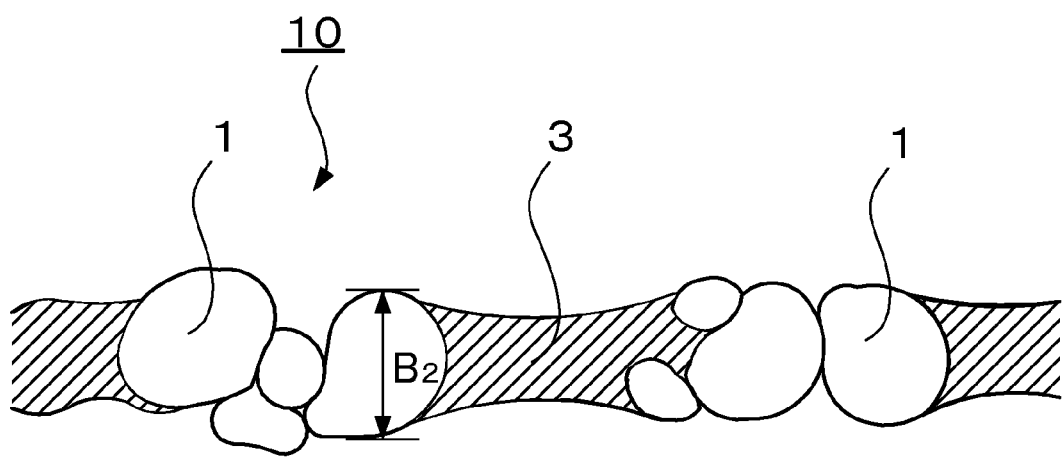
FIG. 6 is a longitudinal sectional schematic view illustrating section Y-Y in FIG. 1; when the warp thread is a multi-filament thread.

FIG. 5 is a longitudinal sectional view illustrating section X1-X1 in the case where the warp thread 1 is multi-filament thread. In this case as well, the value of C is the thickness of the electroconductive tape 10 at the crossing point of the warp thread 1 (multi-filament thread) and weft thread 2 (monofilament thread). FIG. 6 is a longitudinal sectional view illustrating section Y-Y in the case where similarly the warp thread 1 is multi-filament thread. In this case, the multi-filament thread is thread that crosses monofilament thread, and is given the value $B_2$. However, the multifilament thread is such that the arrangement of each single filament in the thread is not set, and the average diameter of the overall thread is not set to a specified value. Therefore, the average diameter of each single filament of the multi-filament thread is taken to be $B_2$. When there are plural kinds of filaments of the multi-filament thread and the average diameter of each is different, the maximum average diameter is taken to be $B_2$.

When the value of M that is obtained in Equation 1 is less than 0.05, the thickness of the electroconductive tape 10 at a crossing point of the warp thread 1 and weft thread 2 becomes too great with respect to the thickness of portions other than a crossing point. Therefore, the smoothness of the surface of the electroconductive tape 10 decreases, and there is a possibility that sufficient grounding and adhesion characteristics will not be obtained. When the value of M exceeds 0.45, deformation of one or both of the warp thread 1 and weft thread 2 is too large, so that the strength of the thread decreases, and there is a possibility that the tensile strength of the electroconductive tape 10 will be insufficient.

The manufacturing method of the electroconductive tape 10 of this embodiment will be explained in the following.

First, the electroconductive mesh fabric is prepared. In other words, using a normal method, mesh fabric is woven from fiber threads by a normal method, and a metallic coating is formed on this using a known method. As described above, the method for forming the metallic coating can be a vapor deposition method, a sputtering method, an electroplating method, an electroless plating method and the like.

Next, adhesive is applied to the top of a peel type sheet to form an adhesive layer. The application method can be a coating method or a pressing method. The thickness D of the adhesive layer is formed to be within the range 50 to 90% the maximum thickness of the electroconductive mesh fabric that was prepared. Even more preferably the thickness D is within a range 65 to 85%.

When the thickness D of the adhesive layer is less than 50% the maximum thickness of the electroconductive mesh fabric, there is a possibility that a sufficient adhesive characteristic will not be obtained. On the other hand, when the thickness D of the adhesive layer exceeds 90% the maximum thickness of the electroconductive mesh fabric, the surface of the electroconductive mesh fabric is covered with an adhesive film, and thus there is a possibility that contact between the metal layer on the frame side and the electroconductive mesh fabric will be hindered. When such a state occurs, the contact resistance value becomes high, and a sufficient grounding characteristic cannot be obtained. After the adhesive layer has been formed, heating and drying are performed using a drying furnace, and with the adhesive layer in a half-hardened state, the material can be provided to the next process.

In the next process, the electroconductive mesh fabric is placed so as to be layered on the adhesive layer that was obtained in the previous process. Laminating can be performed continuously by laminating rollers. The temperature of the laminating rollers can be normal room temperature; however, in order for the adhesive to penetrate well into the open space between threads of the electroconductive mesh fabric, the temperature can be set between 70 to 110° C. With the thickness D of the adhesive layer within the range described above, both surfaces are held between peel type sheets and laminated so that the adhesive layer that is still fluid can penetrate into just the open space between threads of the electroconductive mesh fabric.

Next, an aging process is performed. The aging process is performed by letting the fabric set for 72 to 120 hours under a 40° C., for example. Through this aging process, the adhesive layer hardens and becomes an adhesive film

EXAMPLES

In the following, the present invention will be explained in further detail with examples; however, the present invention is not limited in any way by the following examples. Evaluation of the performance of the electroconductive tape that is obtained was performed by the method described below.

Thickness measurement was performed according to the Japanese Industrial Standard JIS Z 0237 using a digital upright gauge R1-205 (Ozaki Manufacturing Co., Ltd).

The contact resistance value was obtained by placing electroconductive tape between two 25 mm×25 mm electroplated copper plates, and putting 500 gf weight on top. A Miliohm Hitester 3540 (Hioki E.E. Corp.) was then used to measure the resistance value between the two copper plates.

The adhesive strength was measured according to Japanese Industrial Standard JIS Z 0237 using an all-purpose tensile tester STA-1225 (Orientec Co., Ltd.), and the adhesive strength of the electroconductive tape on a SUS plate was found under the following conditions:

Adherend: SUS304
Adhesive electroconductive tape size: 25 mm×120 mm
Tension speed: 300 mm/min
Tension direction: 180° pealing Example 1

Manufacture of an Electroconductive Mesh Fabric

The warp thread and weft thread both had a diameter of 27 µm (fineness: 8 dtex) and were made using polyethylene-telephthalate monofilament thread, and flat mesh fabric in which both the warp thread density and the weft thread density were 132 threads/inch was preset at 190° C. After that, calendering was performed at a temperature of 150° C. and linear load of 30 kg/cm. This flat mesh fabric was immersed for two minutes in a 40° C. aqueous solution that included 0.3 g/L of palladium chloride, 30 g/L of stannous chloride, and 300 ml/L of 36% hydrochloric acid, after which it was washed with water. Next, after immersing the fabric in 30° C. fluoroboric acid having an acid concentration of 0.1 N for 5 minutes, the fabric was washed in water. The fabric was then immersed for 5 minutes in a 30° C. electroless copper plating solution that includes 7.5 g/L of copper sulfate, 30 ml/L of 37% formalin, and 85 g/L of Rochelle salt, after which, the fabric was washed in water. Next, the fabric was immersed for 10 minutes in a 35° C. electro nickel plating solution the includes 300 g/L nickel aminosulfonate, 30 g/L boric acid, and 15 g/L nickel chloride and having a pH of 3.7, and current density of 5 A/dm$^2$ to deposit a layer of nickel on the fabric, after which the fabric was washed in water. The maximum thickness of the electroconductive mesh fabric that was obtained was 32 and the opening percentage was 65%.

(Adjustment of the Adhesive Coating Liquid)
Hariacron 508EX: 100 parts
(Acrylic Pressure Sensitive Adhesive, 46% solid, Harima Chemicals Group, Inc.)
BANSENATE B-82: 1.5 parts
(Isocyanate Hardening Agent Harima Chemicals Group, Inc.)

The combined mixture described above, was mixed for 15 minutes to create an adhesive coating liquid.

(Adhesive Coating Process)

A comma-directed coater was used, and with the clearance between the peel type sheet (SLK-80KCT: Sumikakakoushi Co., Ltd.) and the comma head adjusted to 60 µm, the adhesive was uniformly applied. The material was then passed through a dryer at 120° C., to obtain a 23 µm thick adhesive layer. The manufactured electroconductive mesh fabric and another peel type sheet (EKR90R: Lintec Corporation) were layered on the adhesive layer. Furthermore, the layers were laminated together using laminator rollers at a temperature of 90° C. and pressure of 3 kg/cm², and wound up.

(Aging and Evaluation)

The obtained roll above was then aged for three days in that condition at 40° C., and the adhesive layer was hardened. The obtained electroconductive tape was such that the oblateness of the warp thread was 1.50, the oblateness of the weft thread was 1.30, and the M value was 0.41. The contact resistance value was 5.4 mΩ, the adhesive strength was 7.28 N/inch on the A surface (surface on the side where the adhesive was applied) and was 4.31 N/inch on the B surface (surface on the side where the adhesive oozed out), all of which are good values. Moreover, in regards to the handling capability, the electroconductive tape was not torn during application, and had sufficient strength.

Example 2

Manufacture of an Electroconductive Mesh Fabric

The warp thread and weft thread both had a diameter of 27 μm (fineness: 8 dtex) and were made using polyethylene-telephthalate monofilament thread, and flat mesh fabric in which both the warp thread density and the weft thread density were 132 threads/inch was preset at 190° C. After that, the plating process was performed by the same method as in Example 1. The maximum thickness of the electroconductive mesh fabric that was obtained was 47 μm, and the opening percentage was 72%.

(Adhesive Coating Process)

A comma-directed coater was used, and with the clearance between the peel type sheet (SLK-80KCT: Sumikakakoushi Co., Ltd.) and the comma head adjusted to 110 μm, the adhesive was uniformly applied as in Example 1. The material was then passed through a dryer at 120° C., to obtain a 40 μm thick adhesive layer. The manufactured electroconductive mesh fabric and another peel type sheet (EKR90R: Lintec Corporation) were layered on the adhesive layer. Furthermore, the layers were laminated together using laminator rollers at a temperature of 90° C. and pressure of 3 kg/cm², and wound up.

(Aging and Evaluation)

The obtained roll above was then aged for three days in that condition at 40° C., and the adhesive layer was hardened. The obtained electroconductive tape was such that the oblateness of both the warp thread and weft thread was 1.10, and the M value was 0.09. The contact resistance value was 3.1 mΩ, the adhesive strength was 8.83 N/inch on the A surface, and was 8.37 N/inch on the B surface (surface on the side where the adhesive oozed out), all of which are good values. Moreover, in regards to the handling capability, the electroconductive tape was not torn during application, and had sufficient strength.

Example 3

Manufacture of an Electroconductive Mesh Fabric

The warp thread had a diameter of 27 μm (fineness: 8 dtex) and was made using polyethylene-telephthalate monofilament thread, the weft thread had a diameter of 27 μm (fineness: 8 dtex) and was made using polyethylene-telephthalate monofilament fused thread, and flat mesh fabric in which both the warp thread density and the weft thread density were 100 threads/inch was preset at 190° C. Next, calendering was performed at a temperature of 90° C. and linear load of 30 kg/cm. After that, the plating process was performed by the same method as in Example 1. The maximum thickness of the electroconductive mesh fabric that was obtained was 28 μm, and the percentage of open space was 80%.

(Adhesive Coating Process)

A comma-directed coater was used, and with the clearance between the peel type sheet (SLK-80KCT: Sumikakakoushi Co., Ltd.) and the comma head adjusted to 60 μm, the adhesive was uniformly applied as in Example 1. The material was then passed through a dryer at 120° C., to obtain a 23 μm thick adhesive layer. The manufactured electroconductive mesh fabric and another peel type sheet (EKR90R: Lintec Corporation) were layered on the adhesive layer. Furthermore, the layers were laminated together using laminator rollers at a temperature of 90° C. and pressure of 3 kg/cm², and wound up.

(Aging and Evaluation)

The obtained roll above was then aged for three days in that condition at 40° C., and the adhesive layer was hardened. The obtained electroconductive tape was such that the oblateness of the warp thread was 1.63, the oblateness of the weft thread was 1.56, and the M value was 0.37. The contact resistance value was 3.5 mΩ, the adhesive strength was 8.91 N/inch on the A surface, and was 8.66 N/inch on the B surface, all of which are good values. Moreover, in regards to the handling capability, the electroconductive tape was not torn during application, and had sufficient strength.

Comparative Example 1

Manufacture of an Electroconductive Mesh Fabric

Both the warp thread and weft thread had a diameter of 27 μm (fineness: 8 dtex) and were made using polyethylene-telephthalate monofilament thread, and without performing presetting, plating was performed by the same method as in the first example on flat mesh fabric in which both the warp thread density and the weft thread density were 132 threads/inch. The maximum thickness of the electroconductive mesh fabric that was obtained was 51 μm, and the opening percentage was 72%.

(Adhesive Coating Process)

A comma-directed coater was used, and with the clearance between the peel type sheet (SLK-80KCT: Sumikakakoushi Co., Ltd.) and the comma head adjusted to 120 μm, the adhesive was uniformly applied as in Example 1. The material was then passed through a dryer at 120° C., to obtain a 45 μm thick adhesive layer. The manufactured electroconductive mesh fabric with the maximum thickness 51 μm and the opening percentage 72% and another peel type sheet (EKR90R: Lintec Corporation) were layered on this adhesive layer. Furthermore, the layers were laminated together using laminator rollers at a temperature of 90° C. and pressure of 3 kg/cm², and wound up.

(Aging and Evaluation)

The obtained roll above was then aged for three days in that condition at 40° C., and the adhesive layer was hardened. The obtained electroconductive tape was such that the oblateness of both the warp thread and weft thread was 1.1, and the M value was 0.04. The contact resistance value was 21.6 mΩ, and the grounding characteristic was low. The adhesive strength was 9.70 N/inch on the A surface, and was 1.91 N/inch on the B surface, so the adhesive strength on the B surface side was insufficient.

Example 4

Manufacture of an Electroconductive Mesh Fabric

The warp thread had a diameter of 27 μm (fineness: 8 dtex) and was made using polyethylene-telephthalate monofilament thread, the weft thread had a diameter of 27 μm (fineness: 8 dtex) and was made using polyethylene-telephthalate monofilament fused thread, and flat mesh fabric in which both the warp thread density and the weft thread density were 100 threads/inch was preset at 190° C. Next, calendering was performed at a temperature of 160° C. and linear load of 30 kg/cm. After that, the plating process was performed by the same method as in Example 1. The maximum thickness of the electroconductive mesh fabric that was obtained was 23 μm and the opening percentage was 81%.

(Adhesive Coating Process)

A comma-directed coater was used, and with the clearance between the peel type sheet (SLK-80KCT: Sumikakakoushi Co., Ltd.) and the comma head adjusted to 50 μm, the adhesive was uniformly applied as in Example 1. The material was then passed through a dryer at 120° C., to obtain a 20 μm thick adhesive layer. The manufactured electroconductive mesh fabric and another peel type sheet (EKR90R: Lintec Corporation) were layered on the adhesive layer. Furthermore, the layers are laminated together using laminator rollers at a temperature of 90° C. and pressure of 3 kg/cm², and wound up.

(Aging and Evaluation)

The obtained roll above was then aged for three days in that condition at 40° C., and the adhesive layer was hardened. The obtained electroconductive tape was such that the oblateness of the warp thread was 2.41, the oblateness of the weft thread was 2.37, and the M value was 0.33. The contact resistance value was 2.8 mΩ, the adhesive strength was 9.56 N/inch on the A surface, and was 9.16 N/inch on the B surface, all of which are good values. Moreover, in regards to the handling capability, the electroconductive tape was not torn during application, and had sufficient strength.

Comparative Example 2

Manufacture of an Electroconductive Mesh Fabric

Both the warp thread and weft thread had a diameter of 27 μm (fineness: 8 dtex) and were made using polyethylene-telephthalate monofilament thread, and without performing presetting, plating was performed by the same method as in the first example on flat mesh fabric in which both the warp thread density and the weft thread density were 132 threads/inch. The maximum thickness of the electroconductive mesh fabric that was obtained was 51 μm, and the opening percentage was 72%.

(Adhesive Coating Process)

A comma-directed coater was used, and with the clearance between the peel type sheet (SLK-80KCT: Sumikakakoushi Co., Ltd.) and the comma head adjusted to 120 μm, the adhesive was uniformly applied as in Example 1. The material was then passed through a dryer at 120° C., to obtain a 45 μm thick adhesive layer. The manufactured electroconductive mesh fabric and another peel type sheet (EKR90R: Lintec Corporation) were layered on the adhesive layer. Furthermore, the layers were laminated together using laminator rollers at a temperature of 60° C. and pressure of 2 kg/cm², and wound up.

(Aging and Evaluation)

The obtained roll above was then aged for three days in that condition at 40° C., and the adhesive layer was hardened. The obtained electroconductive tape was such that the oblateness of the warp thread was 1.06, the oblateness of the weft thread was 1.08, and the M value was 0.04. The contact resistance value was 24.3 mΩ, and the grounding characteristic was low. The adhesive strength was 8.80 N/inch on the A surface, and was 1.32 N/inch on the B surface, so that the adhesive strength on the B surface side was insufficient.

Example 5

Manufacture of an Electroconductive Mesh Fabric

The warp thread had a diameter of 27 μm (fineness: 8 dtex) and was made using polyethylene-telephthalate monofilament thread, the weft thread had a diameter of 27 μm (fineness: 8 dtex) and was made using polyethylene-telephthalate monofilament fused thread, and flat mesh fabric in which both the warp thread density and the weft thread density were 100 threads/inch was preset at 190° C. The plating process was performed by the same method as in Example 1. The maximum thickness of the electroconductive mesh fabric that was obtained was 44 μm, and the opening percentage was 82%.

(Adhesive Coating Process)

A comma-directed coater was used, and with the clearance between the peel type sheet (SLK-80KCT: Sumikakakoushi Co., Ltd.) and the comma head adjusted to 100 μm, the adhesive was uniformly applied as in Example 1. The material was then passed through a dryer at 120° C., to obtain a 37 μm thick adhesive layer. The manufactured electroconductive mesh fabric and another peel type sheet (EKR90R: Lintec Corporation) were layered on the adhesive layer. Furthermore, the layers are laminated together using laminator rollers at a temperature of 90° C. and pressure of 3 kg/cm², and wound up.

(Aging and Evaluation)

The obtained roll above was then aged for three days in that condition at 40° C., and the adhesive layer was hardened. The obtained electroconductive tape was such that the oblateness of both the warp thread and weft thread was 1.1, and the M value was 0.20. The contact resistance value was 2.0 mΩ, the adhesive strength was 10.80 N/inch on the A surface, and was 8.50 N/inch on the B surface, all of which are good values. Moreover, in regards to the handling capability, the electroconductive tape had sufficient strength not torn during application.

Comparative Example 3

Manufacture of an Electroconductive Mesh Fabric

Both the warp thread and weft thread had a diameter of 49 μm (fineness: 26 dtex) and were made using polyethylene-telephthalate monofilament thread, and without performing presetting, plating was performed by the same method as in the first example on flat mesh fabric in which both the warp thread density and the weft thread density were 200 threads/inch. The maximum thickness of the electroconductive mesh fabric that was obtained was 94 μm, and the opening percentage was 37%.

(Adhesive Coating Process)

A comma-directed coater was used, and with the clearance between the peel type sheet (SLK-80KCT: Sumikakakoushi Co., Ltd.) and the comma head adjusted to 210 μm, the adhesive was uniformly applied as in Example 1. The material was then passed through a dryer at 120° C., to obtain a 78 μm thick adhesive layer. The manufactured electroconductive mesh fabric and another peel type sheet (EKR90R: Lintec Corporation) were layered on the adhesive layer. Furthermore, the layers were laminated together using laminator rollers at a temperature of 60° C. and pressure of 2 kg/cm², and wound up.

(Aging and Evaluation)

The obtained roll above was then aged for three days in that condition at 40° C., and the adhesive layer was hardened. The obtained electroconductive tape was such that the oblateness of the warp thread was 1.05, the oblateness of the weft thread was 1.06, and the M value was 0.04. The contact resistance value could not be measured (infinity), there was no grounding characteristic and conductivity was not obtained. The adhesive strength was 19.63 N/inch on the A surface, and was 6.65 N/inch on the B surface, where were good values.

The results from examples 1 to 5 and comparative examples 1 to 3 are summarized in Table. 1.

TABLE 1

| | | average oblateness | | Opening percentage (%) | Contact resistance value mΩ | Adhesive strength (N/inch) | |
|---|---|---|---|---|---|---|---|
| | M value | Warp thread | Weft thread | | | A surface | B surface |
| Example 1 | 0.41 | 1.50 | 1.30 | 65 | 5.4 | 7.28 | 4.31 |
| Example 2 | 0.09 | 1.10 | 1.10 | 72 | 3.1 | 8.83 | 8.37 |
| Example 3 | 0.37 | 1.63 | 1.56 | 80 | 3.5 | 8.91 | 8.66 |
| Comparative example 1 | 0.04 | 1.10 | 1.10 | 72 | 21.6 | 9.70 | 1.91 |
| Example 4 | 0.33 | 2.41 | 2.37 | 81 | 2.8 | 9.56 | 9.16 |
| Comparative example 2 | 0.04 | 1.06 | 1.08 | 72 | 24.3 | 8.80 | 1.32 |
| Example 5 | 0.20 | 1.10 | 1.10 | 82 | 2.0 | 10.80 | 8.50 |
| Comparative example 3 | 0.04 | 1.05 | 1.06 | 37 | Not measureable | 19.63 | 6.65 |

As illustrated in Table 1, in example 1 in which the M value that is expressed by Equation 1 is 0.41, example 2 in which M=0.09, example 3 in which M=0.37, example 4 in which M=0.33 and example 5 in which M=0.20, the contact resistance values in each is low and the grounding characteristic is good. Moreover, the measured values for the adhesive force for both the A surface and B surface are large, so that the adhesive property on both sides is good.

On the other hand, in comparative example 1 in which the M value that is expressed by Equation 1 is 0.04, the contact resistance value is 21.6 mΩ, which is great, and the grounding characteristic is low. Moreover, the measured value for the adhesive force is 1.91 N/inch for the B surface, which is low, so that the adhesive strength on the B surface side is insufficient. Similarly, in comparative example 2 in which M=0.04, the contact resistance value is 24.3 mΩ, which is high, and the grounding characteristic is low. Moreover, the measured value for the adhesive force is 1.32 N/inch for the B surface, which is low, so that the adhesive strength on the B surface side is insufficient. Also, similarly, in comparative example 3 in which M=0.04, the contact resistance value was too great and could not be measured, and thus the material could not function as electroconductive tape.

Furthermore, an attempt was made to manufacture an electroconductive tape having a value of M that is expressed by Equation 1 that exceeded 0.45. However, all samples were damaged and a fabric could not be made.

From the results above, in order to obtain an electroconductive table having excellent characteristics it is necessary for the value of M that is expressed by Equation 1 to be within the range 0.05 to 0.45.

As illustrated in Table 1, in embodiment 1 in which the average oblateness of thermoplastic synthetic fiber monofilament thread is 1.50 for warp thread and 1.30 for weft thread, in embodiment 2 in which the average oblateness was 1.10 for warp thread and 1.10 for weft thread, in embodiment 3 in which the average oblateness was 1.63 for warp thread and 1.56 for weft thread, in embodiment 4 in which the average oblateness was 2.41 for warp thread and 2.37 for weft thread, and in embodiment 5 in which the average oblateness was 1.10 for warp thread and 1.10 for weft thread, the contact resistance value for each embodiment was low and the grounding characteristic was good. Moreover, the measured value of the adhesive force was large for both the A surface and the B surface, so that the adhesive property for both sides was good.

On the other hand, in comparative example 2 in which the average oblateness was 1.06 for warp thread and 1.08 for weft thread, the contact resistance value was 24.3 mΩ, which is great, and the grounding characteristic was lower than that in comparative example 1. Moreover, the measured value of the adhesive force as well was 1.32 N/inch for the B surface, which is low, so that the adhesive strength on the B surface side is more insufficient than in comparative example 1. In comparative example 3 in which the average oblateness was 1.05 for warp thread and 1.06 for weft thread, the contact resistance value was too great and could not be measured, so that the material could not be used as electroconductive tape, and was worse than comparison examples 1 and 2.

Furthermore, an attempt was made to manufacture electroconductive tape having an average oblateness that was greater than 3.0. However, all samples were damaged, and fabric could not be manufactured.

From the result above, in order to obtain an electroconductive tape having excellent properties, it is preferred that the thermoplastic synthetic monofilament thread have an average oblateness in the cross-sectional shape that is within the range of 1.1 to 3.0. It is even more preferable that the average oblateness be within the range of 1.1 to 2.5.

As illustrated in Table 1, the opening percentage of the electroconductive mesh fabric gradually became greater from embodiment 1 to embodiment 5. Accordingly, the contact resistance value was kept at a low value while the adhesive force gradually became greater, and there was a good grounding characteristic. However, an attempt was made to manufacture an electroconductive tape from an electroconductive mesh fabric having an opening percentage greater than 90%, however the material could not be handled as fabric, so processing was not possible. Moreover, in comparative example 3 in which the opening percentage of the electroconductive mesh fabric was 37%, the contact resistance value was too great and could not be measured, so the fabric could not function as electroconductive tape. The opening percentage is small and a sufficient amount of adhesive cannot penetrate, so the adhesive covers the front surface of the electroconductive tape, and causes insufficient exposure of metallic coating.

From the result above, in order to obtain an electroconductive tape having excellent characteristics, it is preferred that the opening percentage of the electroconductive mesh fabric be within a range of 45 to 90%. More preferably, the opening percentage of the electroconductive mesh fabric is within the range of 60 to 85%.

This specification is based on Japanese Patent Application No. 2011-133941 filed on Jun. 16, 2011, with the entire specification, claims and drawings of Japanese Patent Application No. 2011-133941 being incorporated in this specification by reference.

INDUSTRIAL APPLICABILITY

The electroconductive tape of the present invention can be used as an ultra-thin electromagnetic wave shield gasket for electronic equipment.

DESCRIPTION OF REFERENCE NUMERALS

1 Warp thread
2 Weft thread
3 Adhesive film
10 Electroconductive tape

The invention claimed is:

1. Electroconductive tape comprising:
   electroconductive mesh fabric having a metallic coating on the surface thereof; and
   an adhesive film that is composed of an adhesive that is formed in only open spaces between threads of the electroconductive mesh fabric; wherein
   the metallic coating is exposed and not covered by the adhesive film on both surfaces of the electroconductive mesh fabric;
   at least one of the threads of the electroconductive mesh fabric is a thermoplastic synthetic fiber monofilament thread; and
   an M value that is obtained by Equation 1 below is within a range of 0.05 to 0.45:

[Equation 1]

$$M = [(B_1+B_2)-C]/(B_1+B_2) \qquad \text{Eq. 1}$$

(where
   $B_1$: Average diameter of the monofilament in the thickness direction of the electroconductive tape at places other than at the crossing points;
   $B_2$: Average diameter of the thread that crosses the monofilament in the thickness direction of the electroconductive tape at places other than at the crossing points;
   C: Thickness of the electroconductive tape at the crossing points where the monofilament crosses other thread).

2. The electroconductive tape according to claim 1, wherein the thermoplastic synthetic fiber monofilament thread has an average oblateness in the cross-sectional shape within a range of 1.1 to 3.0.

3. The electroconductive tape according to claim 1 or claim 2, wherein the opening percentage of the electroconductive mesh fabric is within a range of 45 to 90%.

* * * * *